United States Patent
Ohshima

(10) Patent No.: US 8,143,867 B2
(45) Date of Patent: Mar. 27, 2012

(54) ELECTRIC POWER SUPPLY DEVICE

(75) Inventor: Shunzou Ohshima, Kosai (JP)

(73) Assignee: Yazaki Corporation, Tokyo (JP)

( * ) Notice: Subject to any disclaimer, the term of this patent is extended or adjusted under 35 U.S.C. 154(b) by 330 days.

(21) Appl. No.: 12/596,861

(22) PCT Filed: Mar. 18, 2009

(86) PCT No.: PCT/JP2009/055333
§ 371 (c)(1),
(2), (4) Date: Oct. 21, 2009

(87) PCT Pub. No.: WO2009/116589
PCT Pub. Date: Sep. 24, 2009

(65) Prior Publication Data
US 2010/0127677 A1 May 27, 2010

(30) Foreign Application Priority Data
Mar. 19, 2008 (JP) .................................. 2008-072324

(51) Int. Cl.
*G05F 1/00* (2006.01)
(52) U.S. Cl. .......... 323/222; 323/271; 323/284; 361/18; 361/88; 361/90; 361/91.1
(58) Field of Classification Search .................. 323/222, 323/223, 224, 271, 282, 284; 361/18, 88, 361/90, 91.1, 92
See application file for complete search history.

(56) References Cited

U.S. PATENT DOCUMENTS

| | | | | |
|---|---|---|---|---|
| 6,140,806 A | * | 10/2000 | Gohara | 323/282 |
| 6,222,709 B1 | * | 4/2001 | Baba | 361/18 |
| 6,377,428 B1 | * | 4/2002 | Ogasawara | 361/86 |
| 7,443,645 B2 | * | 10/2008 | Ohshima | 361/79 |
| 2002/0105769 A1 | | 8/2002 | Sato et al. | |
| 2005/0286200 A1 | | 12/2005 | Ohshima | |

FOREIGN PATENT DOCUMENTS

| | | |
|---|---|---|
| JP | 4-142468 A | 5/1992 |
| JP | 2002-232280 A | 8/2002 |
| JP | 2002-315177 A | 10/2002 |
| JP | 2006-005581 A | 1/2006 |

OTHER PUBLICATIONS

International Search Report (PCT/ISA/210), issued in PCT/JP2009/055333, dated Apr. 21, 2009.

* cited by examiner

*Primary Examiner* — Adolf Berhane
*Assistant Examiner* — Nguyen Tran
(74) *Attorney, Agent, or Firm* — Sughrue Mion, PLLC

(57) ABSTRACT

In an electric supply device of the present invention, since a semiconductor element T1 is interrupted before a drain voltage V1 of the semiconductor element T1 is lower than an in-phase input minimum voltage, a load circuit can be assuredly protected. Further, assuming that a first decided voltage is L-V1 and a second decided voltage V3, when the voltage V1 becomes "V1<L-V1", a retry operation is carried out. When the number of times of "V1<L-V1" reaches N1 times, or when the number of times of "L-V1<V1<V3" reaches N2 times, an interrupted state of the semiconductor element T1 is held to protect the load circuit. Further, when the voltage V1 suddenly drops due to an imperfect contact of a connector 11, a minimum value of the voltage V1 is not a stable value and the interrupted state of the semiconductor T1 is not held.

12 Claims, 8 Drawing Sheets

US 8,143,867 B2

ELECTRIC POWER SUPPLY DEVICE

TECHNICAL FIELD

The present invention relates to an electric power supply device for supplying an electric power to a load by controlling a semiconductor element to be turned on and off, and more particularly to a technique for instantaneously interrupting a circuit when a wiring is short-circuited.

BACKGROUND ART

As a usual electric power supply device, for instance, a device is known that is disclosed in JP-A-2006-5581 (patent literature 1).

FIG. 9 is a circuit diagram of the device disclosed in the patent literature 1. A circuit shown in FIG. 9 supplies an electric power of a battery to a load such as a lamp or a motor mounted on, for instance, a vehicle to drive the load. In the circuit, a semiconductor element (T101) such as an MOSFET is provided between a load 102 and a battery VB to switch turning on and off of the semiconductor element (T101) so that the load 102 is controlled to be driven and stopped.

A drain (a point P1) of the semiconductor element (T101) is connected to a connector 101. The connector 101 is connected to a positive terminal of the battery VB through a wiring W1 of a power source side. Further, a source (a point P2) of the semiconductor element (T101) is connected to the load through a wiring W2 of a load side.

Here, a resistance of the wiring W1 of the power source side is supposed to be Rw1, an inductance is supposed to be L1, a resistance of the wiring W2 of the load side is supposed to be Rw2 and an inductance is supposed to be L21+L22.

Further, a gate of the semiconductor element (T101) is connected to an output terminal of a driver 104 through a resistance R5. The driver 104 is controlled by a control logic circuit 105. Then, when an input signal switch SW1 is turned on so that a start input terminal of the control logic circuit 105 is grounded, the control logic circuit 105 drives the driver 104 to supply a voltage of a charge pump 103 to the gate of the semiconductor element (T101) and turn on the semiconductor element (T101). Thus, an electric power output from the battery VB is supplied to the load via the semiconductor element (T101).

Further, the point P1 branches to two systems. One branch line is connected to a negative input terminal of a comparator CMP 102, and the other branch line is grounded through a series connecting circuit of resistances R1 and R2. Then, a connecting point P3 (voltage V3) of the resistances R1 and R2 is grounded through a capacitor C1 and connected to a positive input terminal of the comparator CMP 102.

Now, when the wiring W2 of the load side is grounded at a point P4 due to a failure of the short-circuit of the wiring, a short-circuit current is supplied to a path from the battery VB, through the wiring W1 of the power source side, the connector 101, the point P1, the semiconductor element T101, the wiring W2 of the load side (Rw2, L21), the point P4 and a grounding resistance Rw3, to a GND. A drain voltage (a voltage at the point P1) V1 of the semiconductor element (T101) is lowered. Then, the voltage V1 is input to the negative input terminal of the comparator CMP 102. A decided voltage V3 obtained by dividing the voltage V1 before the short-circuit of the wiring occurs (before the point P4 is grounded) by the resistances R1 and R2 is input to the positive input terminal of the comparator CMP 102 so that the voltage V1 (the voltage V1 after the short-circuit of the wiring occurs) is compared with the decided voltage V3 by the comparator CMP 102.

Then, since the decided voltage V3 is changed with a time constant due to the existence of the capacitor C1, the decided voltage V3 hardly changes for a while after the short-circuit of the wiring occurs. Accordingly, at the time of the occurrence of the short-circuit of the wiring, a relation of V1<V3 is established so that an output signal of the comparator CMP 102 is inverted to an H level from an L level. When the inversion of the output signal of the comparator CMP 102 is input to the control logic circuit 105, the control logic circuit 105 grounds an output of the driver 104. As a result, the semiconductor element (T101) is turned off so that the semiconductor element (T101) and the wiring of a load circuit are protected from an over-current due to the short-circuit of the wiring.

Here, an amount of fall of the voltage V1 may be calculated as described below when the short-circuit current is supplied to the inductances L1 and L21 due to the occurrence of the short-circuit of the wiring at the point P4.

Initially, a circuit current is calculated when a voltage is applied to a circuit including an inductance and a resistance. FIG. 10A shows a circuit in which an SW, a resistance R and an inductance L are connected in series and provided between a power source VB and a GND. Assuming that the circuit current obtained when the SW is turned on at t=0 is I, $$VB = L * dI/dt + R * I$$

$$I = VB/R \{1 - \mathrm{Exp}(-R/L * t)\}$$

$$dI/dt = VB/L * \mathrm{Exp}(-R/L * t)$$

$$dI/dt|_{t=0} = VB/L$$

A current wave form at this time is shown in FIG. 10B. When t=0, I=0[A]. With the elapse of time, the current I exponential functionally increases and converges to a current value VB/R. The gradient dI/dt of the current I at that time is maximum when t=0 and a value thereof is VB/L.

FIG. 10C shows a circuit similar to a load circuit shown in FIG. 9 in which a short-circuit of a wiring occurs between a semiconductor element (T101) and a load. Further, FIG. 10D shows a change of a drain voltage V1 of the semiconductor element (T101) when t=0 and the semiconductor element (T101) is turned on. Assuming that a resistance and an inductance of a wiring of a power source side are R1 and L1, and a resistance and an inductance between the source of the T101 and a GND are R2 and L2, a counter electromotive force E1 generated in the inductance L1 of a power line when t=0 and V1 at that time are expressed as described below.

$$E1 = VB * L1/(L1 + L2) \tag{1}$$

$$V1 = VB - E1 = VB * L2/(L1 + L2) \tag{2}$$

In the circuit shown in FIG. 9, assuming that a counter electromotive force E1 obtained when the short-circuit of the wiring does not occur in the point P4 and a counter electromotive force E1 obtained when the short-circuit of the wiring occurs in the point P4 are respectively E1a and E1b, they are applied to the equation (1), $$E1a = VB * L1/(L1 + L21 + L22 + Lz)$$

$$E1b = VB * L1/(L1 + L21)$$

Then, since L22+Lz≠0, E1a<E1b ... (3) is established.

Namely, when the semiconductor element (T101) is turned on under a state that the wiring W2 of the load side is short-circuited, an amount of drop E1b of the voltage V1 is always larger than an amount of drop E1a obtained when the wiring is normal. Further, as the inductance Lz of the load is larger, a difference between them is the more increased. Accordingly, when the level of the voltage V1 (=VB−E1) is compared with the decided voltage V3, if the decided voltage V3 is set to a value smaller than a voltage "VB−E1a" in a normal state, when "V1<V3" is detected, the wiring W2 of the load side may be decided to be short-circuited. The inductance of the wiring is about 1 [μH/m] and hardly depends on a sectional area of the wiring. Accordingly, in such an extremely dead short-circuit as to have a length of the wiring between P2 and P4 of 0.2 m when the length of the wiring of the power source side is 2 m, the voltage V1 drops to 1/10 as low as a source voltage VB. When VB=12V, V1 drops to V1=1.2V.

Thus, the voltage V1 drops to a level exceeding an in-phase input voltage range of the comparator CMP 102 that compares the voltage V1 with the decided voltage V3. Here, the "in-phase input voltage range" means a voltage located within a range in which an operational amplifier forming the comparator CMP 102 normally operates. When a voltage lower than this range is input, the operation of the comparator CMP 102 is not assured. That is, the comparator CMP 102 may erroneously operate.

On the other hand, the drop of the voltage V1 may occur from other cause than the short-circuit. For instance, in the circuit shown in FIG. 9, an imperfect contact is supposed to occur in a contact of the connector 101 connected to the wiring W1 of the power source side. As a result, a contact resistance of about 1 [mΩ] during a normal time is supposed to increase to 5[0]. At this time, assuming that as a load current ID, a current of 10 A is supplied, a voltage drop may possibly reach 50 V. When the source voltage VB is VB=12V, the voltage V1 is substantially a level of the GND.

As described above, in an over-current protecting device shown in FIG. 9, when the voltage V1 is extremely lowered to become a lower limit of the in-phase input range of the comparator CMP 102 or lower, a problem arises that the comparator CMP 102 does not function. As a countermeasure for the problem, when the voltage V1 is lower than a lower limit of the in-phase input voltage range, the output of the comparator CMP 102 is forcedly inverted so that the semiconductor element (T101) may be controlled to be interrupted. However, in this method, even when a power is instantaneously interrupted due to the imperfect contact of the connector 101 provided in the power source side, the semiconductor element (T101) is interrupted. Thus, when the instantaneously interrupted source voltage is recovered to a normal voltage, a problem arises that the semiconductor element (T101) cannot be reset to a turning on state.

Patent literature 1: JP-A-2006-5581

DISCLOSURE OF THE INVENTION

Problems that the Invention is to Solve

As shown in FIG. 9, in a system for detecting the occurrence of the over-current on the basis of the amount of fall of the voltage V1, below-described problems arise.

(1) When the voltage V1 is lower than the lower limit value of the in-phase input voltage of the comparator CMP 102, the circuit does not normally operate.

(2) As a cause that the voltage V1 is lower than the lower limit value of the in-phase input voltage, there are two types, namely, the occurrence of the extremely dead short-circuit and the instantaneous interruption of a power due to the imperfect contact of the connector. In the case of the extremely dead short-circuit, the semiconductor element (T101) is kept interrupted. In the case of the instantaneous interruption of the power, when the voltage V1 is recovered, the semiconductor (T101) is reset to be turned on. Thus, completely opposite treatments are necessary.

The present invention is devised to solve the above-described usual problems and it is an object of the present invention to provide an electric power supply device in which when a voltage V1 is lower than a lower limit of an in-phase input voltage and a cause thereof is a dead short-circuit, an interruption of a semiconductor element is maintained, and when a cause thereof is an instantaneous interruption of a power, the semiconductor element is recovered to be turned on after the instantaneous interruption is recovered.

Means for Solving the Problems

In order to achieve the above-described object, the present invention provides an electric power supply device comprising: a semiconductor element (T1); a power source having a positive terminal to which a first main electrode of the semiconductor element is connected through a wiring (W1) of a power source side; a load connected between a second main electrode of the semiconductor element and a ground; and a control portion that controls the semiconductor to be turned on and off to supply an electric power to the load, wherein when a first voltage (V1) of a point between the first main electrode and the wiring of the power source side is lower than a first decided voltage (L-V1), the control portion controls the semiconductor element to be turned off, and the control portion controls the semiconductor element to be turned on when a first prescribed time (t1) is elapsed after the semiconductor element is turned off; and wherein when the semiconductor element is turned on after the first prescribed time (t1) is elapsed so that a minimum value of the first voltage (V1) exceeds the first decided voltage (L-V1), the control portion controls the semiconductor element to continue a turning on state, and when the first voltage (V1) is lower than the first decided voltage (L-V1), the control portion controls the semiconductor element to hold a turning off state.

Further, the present invention provides an electric power supply device comprising: a plurality of load circuits, each of which having a semiconductor element (T1) and a load connected in series; wherein first main electrodes of the plurality of semiconductor elements are respectively connected together through a connecting point (P1), a power source having a positive terminal to which the connecting point (P1) is connected only through a wiring (W1) of a power source side, wherein second main electrodes of the plurality of semiconductor elements are respectively connected to the loads corresponding thereto; and a plurality of control portions that respectively control the semiconductor elements corresponding to the load circuits to be turned on and off to supply an electric power to the corresponding load circuits, wherein when a first voltage (V1) of the first connecting point (P1) is lower than a first decided voltage (L-V1), the control portions control all the semiconductor elements in turning on states to be turned off, and the control portions control the semiconductor element that are turned off to be sequentially turned on with a prescribed time difference when a first prescribed time (t1) is elapsed after the semiconductor elements are turned off; and wherein when the semiconductor elements are turned on after the first prescribed time (t1) is elapsed so that a minimum value of the first voltage (V1) exceeds the first decided voltage (L-V1), the control portions control the semiconductor elements to continue turning on states, and when the first voltage (V1) is lower than the first decided voltage (L-V1), the control portions control the semiconductor elements to respectively hold turning off states.

Preferably, when the first voltage (V1) is lower than the first decided voltage (L-V1), the control portion controls the semiconductor element to be turned off, then, when the semiconductor element is turned on after the first prescribed time (t1) is elapsed, if the first voltage (V1) is lower than the first decided voltage (L-V1) again, the control portion controls the semiconductor element to be turned off again, and then, when the control portion repeats an operation for turning on the semiconductor element again after the first prescribed time (t1) is elapsed a first prescribed number of times (N1) so that the first voltage (V1) obtained when the semiconductor element is turned on during all tries is lower than the first decided voltage (L-V1), the control portion controls the semiconductor element to hold the turning off state.

Here, it is preferable that, the control portion sets a second decided voltage (V3) higher than the first decided voltage (L-V1), then, when the first voltage (V1) is lower than the first decided voltage (L-V1), the control portion controls the semiconductor element in a turning on state to be turned off, then, when the semiconductor element is turned on again after the first prescribed time (t1) is elapsed, if the minimum value of the first voltage (V1) is higher than the first decided voltage (L-V1) and is lower than the second decided voltage (V3), the control portion controls the semiconductor element to be repeatedly turned on and off at intervals of a second prescribed time (t2), then, when the first voltage (V1) is lower than the first decided voltage (L-V1) during a repeating time, the control portion controls the semiconductor element to be repeatedly turned on and off at intervals of the first prescribed time (t1), and during a process of the repeated control, when the semiconductor element is turned on, if the minimum voltage of the first voltage is repeatedly higher than the first decided voltage (L-V1) and is lower than the second decided voltage (V3) continuously a second number of times (N2), or if the minimum value of the first voltage is repeatedly lower than the first decided voltage (L-V1) continuously the first number of times (N1), the control portion controls the semiconductor element to hold an interrupted state.

Here, it is preferable that, when the semiconductor element is turned on again after the semiconductor element is turned off, if the minimum value of the first voltage is higher than the first decided voltage (L-V1) and is lower than the second decided voltage (V3), the control portion raises the second decided voltage and then controls the semiconductor element to be turned on.

Here, it is preferable that, the first prescribed time (t1) and the second prescribed time (t2) are not set to a prescribed time and are changed at random.

Advantages of the Invention

In the above-described structure, when the first voltage is abruptly lowered due the short-circuit of a wiring such as a dead short-circuit, since the semiconductor element is turned off before the first voltage is lower than a lower limit value of an in-phase input voltage of a comparator, a malfunction may be prevented from occurring and the semiconductor element may be assuredly turned off to protect the load circuit.

In the above-described structure, when the plurality load circuits are provided in parallel, if a dead short-circuit occurs in one load circuit and the first voltage is abruptly lowered, since the semiconductor elements are turned off before the first voltages are lower than the lower limit value of the in-phase input voltage of the comparator in the operating load circuits of the plurality of load circuits, the malfunctions may be prevented from occurring respectively in the load circuits and the semiconductor elements may be assuredly turned off to protect the load circuits.

In the above-described structure, when the first voltage is abruptly lowered to be lower than the first decided voltage L-V1, a retry operation is carried out. When the semiconductor element is turned on, if the first voltage V1 is lower than the first decided voltage continuously N1 times (the first prescribed number of times), the turning-off state of the semiconductor element is held. Accordingly, when the wiring is not short-circuited, for instance, when the voltage V1 is lowered due to an imperfect contact of a connector, the turning on state of the semiconductor element may be maintained to continuously drive the load circuit.

In the above-described structure, the first decided voltage L-V1 and the second decided voltage V3 higher than the first decided voltage L-V1 are set. After the first voltage V1 is lower than the first decided voltage L-V1, the retry operation is carried out. When the semiconductor is turned on, if the voltage V1 showing "V1<L-V1" appears continuously N1 times (the first prescribed number of times) or if the voltage V1 showing "L-V1<the minimum value of V1<V3" appears continuously N2 times (the second prescribed number of times), the turning-off state of the semiconductor element is held. Accordingly, when the short-circuit of the wiring such as the dead short-circuit occurs, the turning off state of the semiconductor element may be assuredly held to protect the load circuit.

When the voltage V1 is lowered due to an imperfect contact of a connector provided in the wiring of a load side, the voltage V1 showing "V1<L-V1" or "L-V1<the minimum value of V1<V3" appears, however, the number of times of the appearances of V1 do not reach the above-described prescribed number times N1 and N2. Accordingly, when the voltage V1 is lowered due to the imperfect contact, the turning off state of the semiconductor element is not held so that the load circuit may be operated.

In the above-described structure, the short-circuit of the wiring such as the dead short-circuit occurs to carry out the retry operation. When the semiconductor element is turned on, if the voltage V1 shows "L-V1<the minimum value of V1<V3", the second decided voltage V3 is changed to be gradually increased. Accordingly, when the dead short circuit occurs, the voltage V1 may be prevented from showing "V1<L-V1" or "L-V1<the minimum value of V1<V3" to assuredly hold the turning off state of the semiconductor element and protect the load circuit.

In the above-described structure, the plurality of circuits including the semiconductor elements and the loads are connected to the connecting points (P1). When the circuits are divided into a plurality of groups and controlled by control circuits (IC) independent respectively of the groups, since the control circuits (IC) are respectively independent, timings at which the semiconductor elements are turned on after the semiconductor elements are turned off may possibly correspond. When the two or more semiconductor elements of the plurality of semiconductor elements connected to the connecting points (P1) are turned on at the same time, the normality and abnormality of the load circuits cannot be precisely decided. To meet this problem, time intervals at which the control circuits (IC) respectively restart the semiconductor elements are changed at random, so that the plurality of semiconductor elements may be avoided from being turned on at the same time, and the normality and abnormality of the load circuits may be precisely decided.

DESCRIPTION OF REFERENCE NUMERALS AND SIGNS

Figure 1:
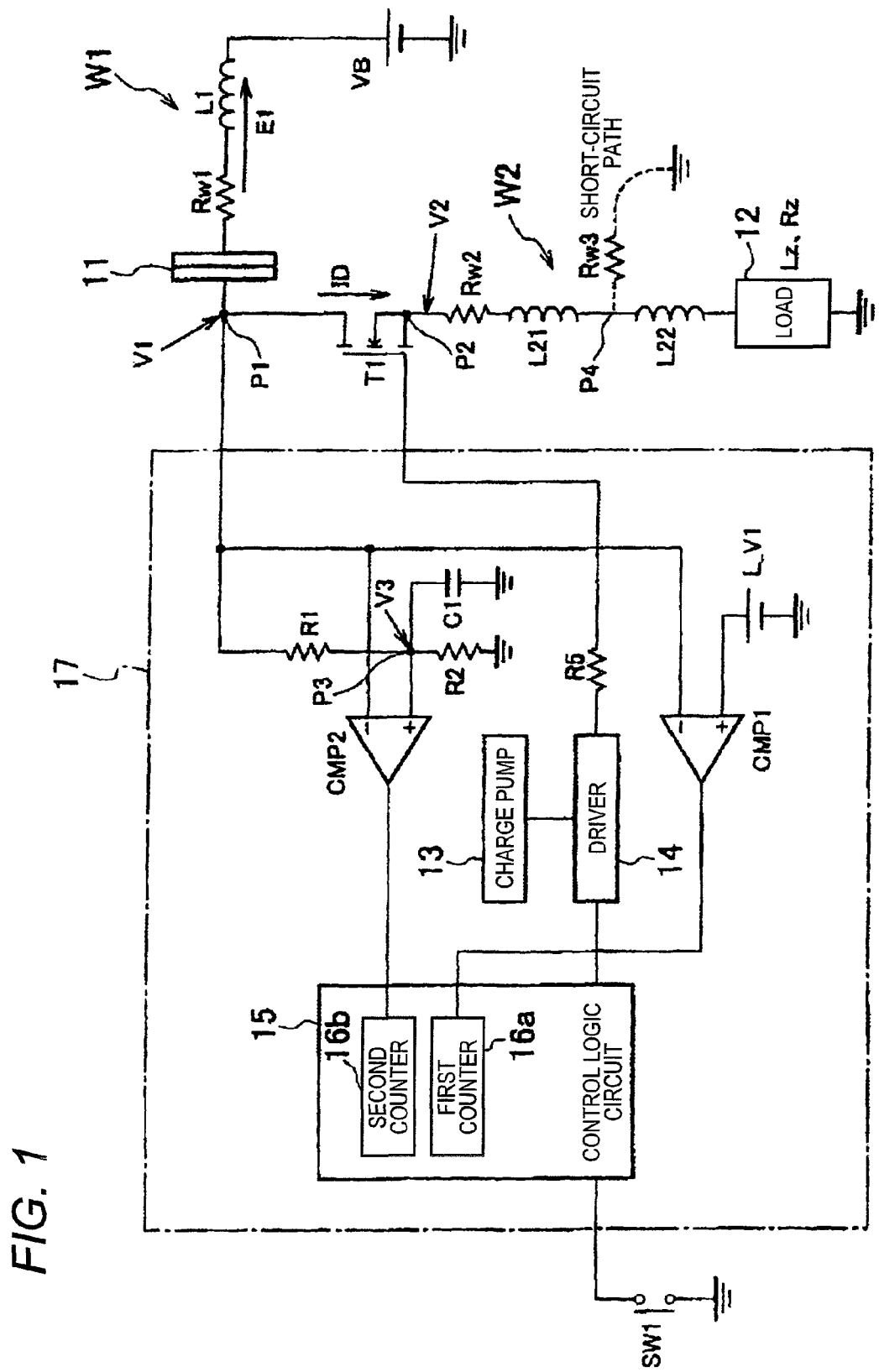
FIG. 1 is a circuit diagram showing the structure of an electric power supply device according to a first embodiment of the present invention.

11 . . . connector 12 . . . load 13 . . . charge pump 14 . . . driver 15 . . . control logic circuit 16a . . . first counter 16b . . . second counter W1 . . . wiring of power source side W2 . . . wiring of load side T1 . . . semiconductor element VB . . . battery

BEST MODE FOR CARRYING OUT THE INVENTION

Now, an embodiment of the present invention will be described by referring to the drawings. FIG. 1 is a circuit diagram showing the structure of a first embodiment of an electric power supply device according to the present invention.

The electric power supply device shown in FIG. 1 supplies an electric power of a battery to a load such as a lamp or a motor mounted on, for instance, a vehicle to drive the load. A semiconductor element T1 such as an MOSFET is provided between a load 12 and a battery VB (for instance, DC 12V) to switch a tuning on and off of the semiconductor T1 so as to control the drive and stop of the load 12.

A drain (a point P1, a first main electrode) of the semiconductor element T1 is connected to a connector 11. The connector 11 is connected to a positive terminal of the battery VB through a wiring W1 of a power source side. Further, a source (a point P2, a second main electrode) of the semiconductor element T1 is connected to an end of the load 12 through a wiring W2 of a load side. Further, the other end of the load 12 is grounded.

Here, a resistance of the wiring W1 of the power source side is supposed to be Rw1 and an inductance is supposed to be L1. A resistance of the wiring W2 of the load side is supposed to be Rw2 and an inductance is supposed to be L21 and L22 divided in a point P4. Further, a resistance of the load 12 is supposed to be Rz and an inductance is supposed to be Lz.

A gate of the semiconductor element T1 is connected to an output terminal of a driver 14 through a resistance R5. The driver 14 is controlled by a control logic circuit 15. Then, when an input signal switch SW1 is turned on so that a start input terminal of the control logic circuit is grounded, the control logic circuit 15 drives the driver 14 to supply a voltage of a charge pump 13 to the gate of the semiconductor element T1 and turn on the semiconductor element T1. As a result, an electric power output from the battery VB is supplied to the load 12 via the connector 11 and the semiconductor element T1.

Further, the point P1 as the drain of the semiconductor element T1 branches to three systems. A first branch line is connected to a negative input terminal of a comparator CMP 2, a second branch line is connected to a negative input terminal of a comparator CMP 1 and a third branch line is grounded through a series connecting circuit of resistances R1 and R2. Then, a connecting point P3 (voltage V3) of the resistances R1 and R2 is grounded through a capacitor C1 and connected to a positive input terminal of the comparator CMP 2.

To a positive input terminal of the comparator CMP 1, a voltage source for outputting a first decided voltage L-V1 is connected. Here, the voltage L-V1 is set to a voltage (for instance, a voltage of about 2[V]) lower than V3 (a second decided voltage) and a little higher than a lower limit value of an in-phase input voltage of the comparator CMP 1.

Further, the control logic circuit 15 includes a first counter 16a and a second counter 16b. As described below, every time an output signal of the comparator CMP 1 is inverted, the first counter 16a is counted up. Every time an output signal of the comparator CMP 2 is inverted, the second counter 16b is counted up.

Further, components (components surrounded by a chain line shown in FIG. 1) such as the control logic circuit 15, the charge pump 13 and the driver 14 are formed as an IC 17 (a control part).

Figure 2:
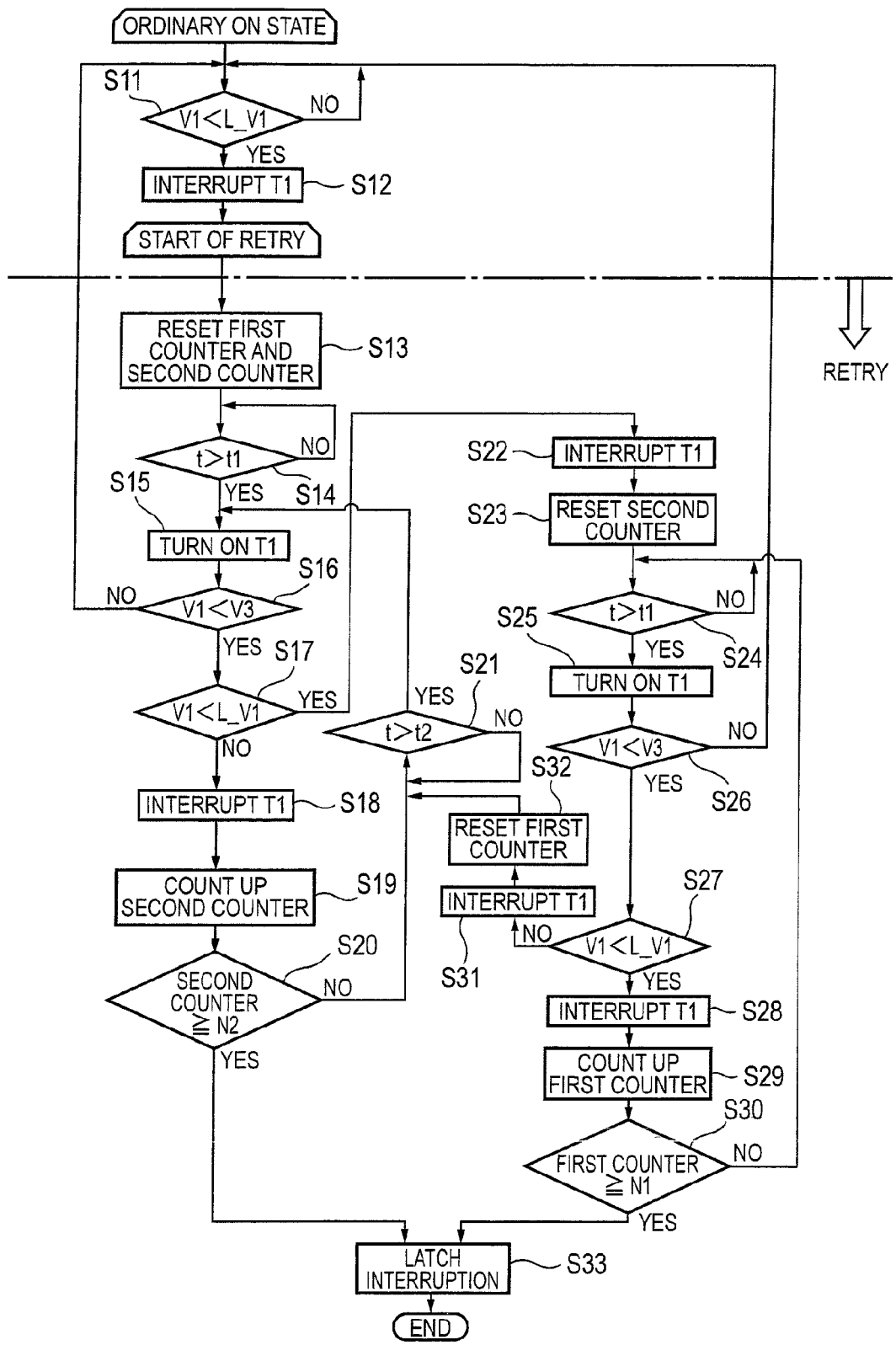
FIG. 2 is a flowchart showing process operations of the electric power supply device according to the first embodiment of the present invention.

Now, an operation of the electric power supply device according to the present embodiment will be described by referring to a flowchart shown in FIG. 2.

During an ordinary operation, when a driving signal is output from the driver 14 to turn on the semiconductor element T1, a load current ID is supplied to the semiconductor element T1 and the electric power is supplied to the load 12 such as the lamp or the motor to drive the load 12. At this time, since a voltage V1 (a first voltage) of the drain (the point P1) of the semiconductor element T1 is higher than the voltage V3 (the second decided voltage) generated at the point P3 as the connecting point of the resistances R1 and R2, the output signal of the comparator CMP 2 has an L level. Similarly, since the voltage V1 is higher than the voltage L-V1 (the first decided voltage) input to the positive input terminal of comparator CMP 1, the output signal of the comparator CMP 1 has an L level.

Here, when a dead short circuit occurs that the point P4 of a load circuit is directly short-circuited to a ground, a short-circuit current is supplied through a resistance Rw3 of a short-circuit path. As a result, since a counter electromotive force E1 is generated in the wiring W1 of the power source side, the voltage V1 of the point P1 is suddenly lowered to be lower than the first decided voltage L-V1 (YES in step S11 in FIG. 2). As a result, the output signal of the comparator CMP 1 is inverted to an H level from the L level.

When the inverted signal of the comparator CMP 1 is input, the control logic circuit 15 stops the driver 14. Namely, an output terminal of the driver 14 is grounded to lower a gate voltage of the semiconductor element T1 substantially to a ground level, turn off the semiconductor element T1 (step S12) and interrupt the supply of the electric power to the load 12. At this time, the control logic circuit 15 activates a timer (an illustration is omitted) to measure an elapse time t after the semiconductor element T1 is turned off. After that, the control logic circuit starts a retry operation. Further, since the semiconductor element T1 is turned off when the voltage V1 is lower than the first decided voltage L-V1, an input voltage of the comparator CMP 1 is not lower than the lower limit value of the in-phase input voltage so that the comparator CMP 1 may be normally operated.

In the retry operation, the control logic circuit 15 resets the first counter 16a and the second counter 16b (step S13). Then, when the elapse time t by the timer reaches a first time t1 (YES in step S14), the control logic circuit outputs a driving command signal to the driver 14 to turn on the semiconductor element T1 (step S15).

Then, the control logic circuit 15 decides whether or not the voltage V1 is lower than the second decided voltage V3 in accordance with the output signal of the comparator CMP 2 (step S16). Then, when the voltage V1 is not lower than the second decided voltage V3, that is, when the output of the comparator CMP 2 is in the L level (NO in the step S16), the control logic circuit returns to the process of the step S11. Namely, the voltage V1 is lowered to be temporarily lower than the first decided voltage L-V1 and the semiconductor element T1 is turned off. Then, when the semiconductor element T1 is turned on again after the time t1 elapses, if the voltage V1 returns to an ordinary voltage, the control logic circuit continuously maintains a turning on state of the semiconductor element T1. In other words, while the semiconductor element T1 carries out the retry operation, when the voltage V1 is returned to a normal value, the control logic circuit continuously holds the turning on state of the semiconductor element T1.

On the other hand, in the process of the step S16, when the voltage V1 is lower than the second decided voltage V3, that is, after the semiconductor element T1 is turned on in the process of the step S15, when the output signal of the comparator CMP 2 is inverted to the H level (YES in the step S16) within, for instance, 40 μsec, the control logic circuit subsequently decides whether or not the voltage V1 is lower than the first decided voltage L-V1 (step S17). Then, when the voltage V1 is not lower than the first decided voltage L-V1, that is, the output signal of the comparator CMP 1 is in the L level (NO in the step S17), the control logic circuit turns off the semiconductor element T1 again (step S18). Namely, when the minimum value of the voltage V1 is located between the first decided value L-V1 and the second decided voltage V3, the control logic circuit advances a process to the step S18.

Further, the control logic circuit counts up (+1) the second counter 16b (step S19). Then, the control logic circuit 15 decides whether or not the count value of the second counter 16b reaches a preset number of times (a second number of times N2, for instance, three times) (step S20)). Then, when the count value of the second counter 16b does not reach N2 (NO in the step S20), after a second preset time t2 elapses (YES in step S21), the control logic circuit turns on the semiconductor element T1 again and repeats the processes from the step S15.

Further, when the count value of the second counter 16b reaches N2 (YES in the step S20), the control logic circuit latches the turning off state of the semiconductor element T1 to protect the load circuit (step S33). Namely, during the execution of the retry operation, when a state that the voltage V1 shows "L-V1<V1<V3" is repeated continuously N2 times (for instance, three times), the control logic circuit decides that a short-circuit of the wiring such as the dead short-circuit occurs to latch the turning off state of the semiconductor element T1 and protect the load circuit.

On the other hand, when the semiconductor element T1 is turned on again, if the voltage V1 is lower than the first decided voltage L-V1 (YES in the step S17), the control logic circuit interrupts the semiconductor element T1 again (step S22) and further resets the second counter 16b (step S23). Then, the control logic circuit decides whether or not the first time t1 elapses (step S24). When the time t1 elapses (YES in the step S24), the control logic circuit turns on the semiconductor element T1 again (step S25).

Then, the control logic circuit 15 decides whether or not the voltage V1 is lower than the second decided voltage V3 in accordance with the output signal of the comparator CMP 2 (step S26). When the voltage V1 is not lower than the second decided voltage V3, that is, when the output of the comparator CMP 2 is in the low level (NO in the step 26), the control logic circuit returns to the process of the step S11. Namely, when the semiconductor element T1 is turned off in the process of the step S22, and the semiconductor element T1 is turned on again after the time t1 elapses, if the voltage V1 returns to the ordinary voltage, the control logic circuit continuously holds the turning on state of the semiconductor element T1.

On the other hand, in the process of the step S26, when the voltage V1 is lower than the second decided voltage V3, namely, after the semiconductor element T1 is turned on in the process of the step S25, when the output signal of the comparator CMP 2 is inverted to the H level within 40 μsec (YES in the step S26), the control logic circuit subsequently decides whether or not the voltage V1 is lower than the first decided voltage L-V1 (step S27). Then, when the voltage V1 is lower than the first decided voltage L-V1, that is, when the output signal of the comparator CMP 1 is in the H level (YES in the step S27), the control logic circuit turns off the semiconductor element T1 again (step S28) and further counts up (+1) the first counter 16a (step S29).

Then, the control logic circuit 15 decides whether or not the count value of the first counter 16a reaches a preset number of times (a first number of times N1, for instance, seven times) (step S30). When the count value of the first counter 16a does not reach N1 (NO in the step S30), after the time t1 elapses (YES in the step S24), the control logic circuit turns on the semiconductor element T1 again to repeat the processes from the step S25.

Further, when the count value of the first counter 16a reaches N1 (for instance, seven times) (YES in the step S30), the control logic circuit latches the turning off state of the semiconductor element T1 to protect the load circuit (the step S33). Namely, when a state that the voltage V1 shows "V1<L-V1" is repeated continuously N1 times, the control logic circuit decides that the short-circuit of the wiring such as the dead-short circuit occurs to interrupt the load circuit.

On the other hand, when the voltage V1 is not lower than the first decided voltage L-V1 in the process of the step 27, that is, when the output signal of the comparator CMP 1 is in the L level (NO in the step 27), the control logic circuit interrupts the semiconductor element T1 again (step S31) and further resets the first counter 16a (step S32). Then, the control logic circuit shifts a process to the step S21.

The above-described process is summarized as described below. When the short-circuit of the wiring such as the dead short-circuit occurs in the load circuit shown in FIG. 1 so that the voltage V1 of the point P1 is abruptly lowered to have a state of "V1<L-V1", the control logic circuit carries out the retry operation for turning on the semiconductor element T1 again (the operation for repeatedly turning on the semiconductor element T1).

Then, when the control logic circuit carries out the retry operation so that the voltage V1 shows "V1<L-V1", the control logic circuit cyclically repeats the retry operation every first time t1. When the number of times of retries (the number of times that the voltage V1 shows "V1<L-V1" when the semiconductor element T1 is turned on) reaches N1 times continuously, the first counter 16a overflows (the above-described step S30) so that the semiconductor element T1 may be maintained in an interrupted state to protect the semiconductor element T1 and the wiring W2 of the load side. Namely, as shown by a characteristic curve S1 of FIG. 4, the retry operation is repeated so that the minimum value of the voltage V1 is stabilized to show "V1<L-V1", the control circuit decides that the dead short circuit occurs to protect the circuit.

Further, when the control logic circuit carries out the retry operation so that the voltage V1 shows "L-V1<V1<V3", the control logic circuit cyclically repeats the retry operation every second time t2. Then, when the number of times of retries (the number of times that the voltage V1 shows "L-V1<V1<V3" when the semiconductor element T1 is turned on) reaches N2 times continuously, the second counter 16b overflows (the above-described step S20), and the semiconductor element T1 is held in an interrupted state so that the semiconductor element T1 and the wiring W2 of the load side may be protected.

Figure 5:
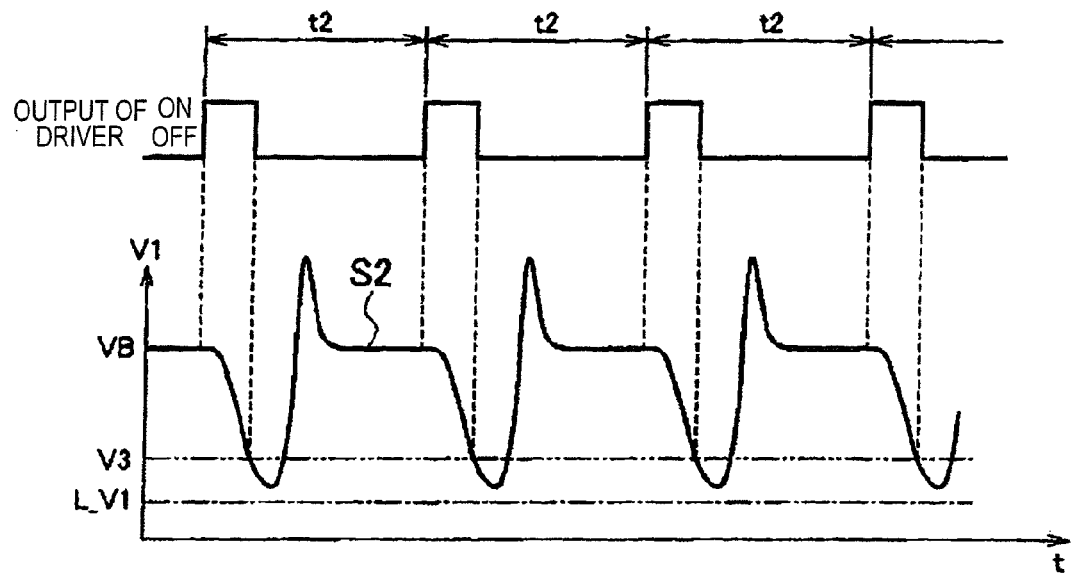
FIG. 5 is a characteristic view showing the change of the voltage V1 when the dead-short circuit occurs and the minimum value of the voltage V1 continuously becomes a voltage located between the first decided voltage L-V1 and a second decided voltage V3 in the embodiment of the present invention.

Namely, when the short-circuit such as the dead short-circuit occurs, since an amount of fall of the voltage V1 is substantially stable, the first counter 16a or the second counter 16b overflows to turn off the semiconductor element T1 so that the circuit may be protected. That is, as shown in a characteristic curve S2 of FIG. 5, when the minimum value of the voltage V1 is stabilized to show "L-V1<V1<V3", the control logic circuit decides that the dead short-circuit occurs to protect the circuit.

Figure 6:
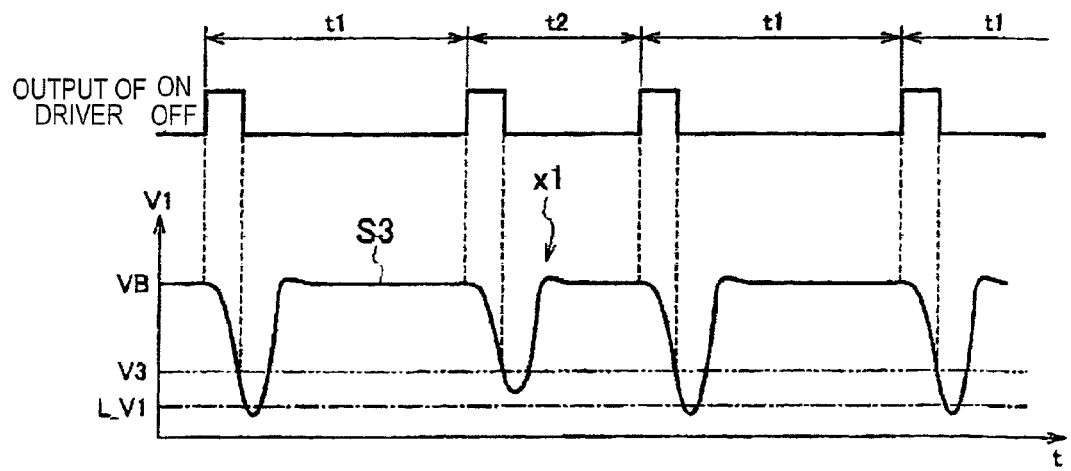
FIG. 6 is a characteristic view showing the change of the voltage V1 when the minimum value of the voltage V1 changes above and below the first decided voltage L-V1 due to an imperfect contact of a connector in the embodiment of the present invention.

On the other hand, when the voltage V1 is lowered due to the imperfect contact of the connector 11 (see FIG. 1) included in a power line to show "V1<L-V1", since the contact resistance of the connector 11 irregularly changes, the voltage V1 shows "V1<L-V1", or "L-V1<the minimum value of V1<V3", or further "V3<the minimum value of V1" during the period of the retry operation. Namely, when the imperfect contact of the connector 11 occurs, the voltage V1 of the point P1 varies unevenly above and below the first decided voltage L-V1 and the second decided voltage V3. For instance, as shown in a characteristic curve S3 of FIG. 6, the minimum value of the voltage V1 is uneven above and below the first decided voltage L-V1.

In this case, the first counter 16a hardly continuously counts N1 times or the second counter 16b hardly continuously counts N2 times. Accordingly, as shown in the step S23 or the step S32, the count value of the first counter 16a and the count value of the second counter 16b are frequently reset, an interruption of the semiconductor element T1 is not held and the retry operation is repeated. When the minimum value of the voltage V1 is higher than the second decided voltage V3, both the first counter 16a and the second counter 16b are reset by the process of the step S13 to maintain the turning on state of the semiconductor element T1.

As described above, in the electric power supply device according to the first embodiment of the present invention, when the dead-short circuit occurs in the load circuit and the voltage V1 is abruptly lowered, the tuning off state of the semiconductor element T1 may be latched to protect the load circuit. Further, when the voltage V1 is abruptly lowered due to the imperfect contact of the connector 11, the retry operation for turning on and off the semiconductor element T1 is carried out, and when the voltage V1 is returned to the ordinary voltage, the turning on state of the semiconductor element T1 is kept. Accordingly, the load circuit may be prevented from being erroneously interrupted due to the imperfect contact of the connector 11.

In the above-described first embodiment, the first time t1 is different from the second time t2 as mentioned above. However, the first time t1 may be the same as the second time t2.

Figure 3:
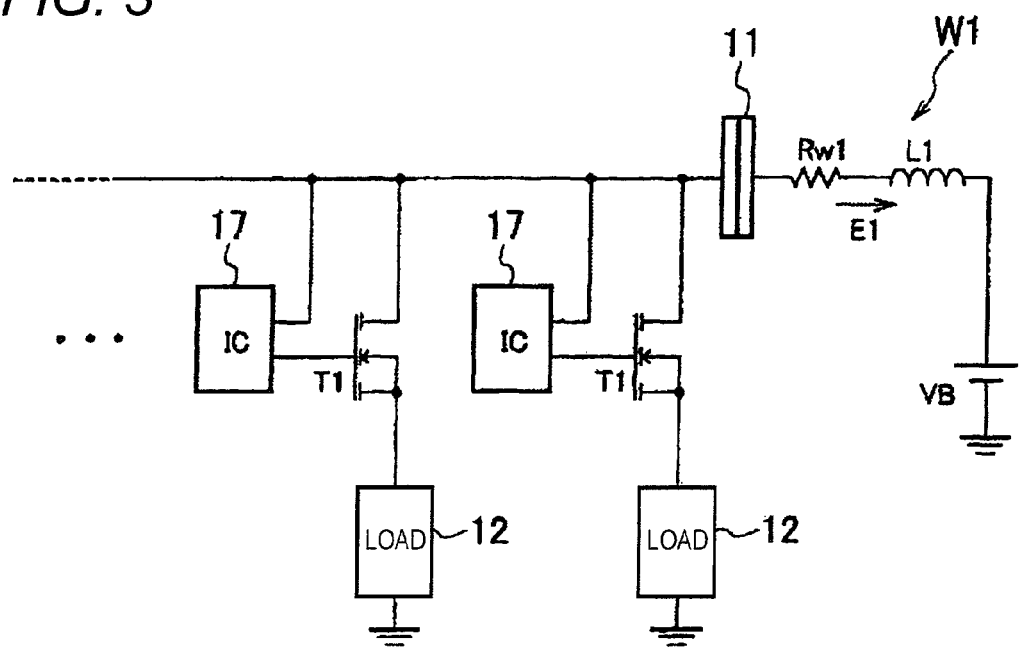
FIG. 3 is a connection diagram showing a state in which a plurality of systems of electric power supply devices is connected in parallel in the first embodiment of the present invention.

Further, in the first embodiment, an electric power supply circuit in which the load circuit of one system is connected to one connector 11 is described as an example. However, as shown in FIG. 3, the present invention may be applied to a circuit structure in which a plurality of load circuits and ICs 17 for controlling semiconductor elements T1 are connected to one connector 11. In this case, a timing at which a retry operation is carried out needs to be shifted by a prescribed time for each load circuit of each system.

This is carried out because of a below-described reason. When two or more of the plurality of semiconductor elements connected to the same power line W1 at points P1 are turned on at the same time during the retry operation, an amount of fall of a voltage V1 is larger than that occurring when the single semiconductor element is turned on so that the short-circuit of a wiring of the load circuit cannot be precisely decided. Namely, an erroneous operation may possibly arise so that a normal load circuit is decided to be abnormal and interrupted. Several semiconductor elements are controlled by a control circuit incorporated in one IC. However, when the number of the semiconductor elements is increased, a plurality of ICs is used. At this time, since the Ics respectively independently operate, when the two or more semiconductors controlled by the different Ics are interrupted at the same time, if the specifications (characteristics) of the ICs are the same, the two or more semiconductor elements are turned on at the same time during the retry operation, so that the above-described erroneous interruption may possibly occur.

To meet the above-described problem, there is a method in which the operations of the ICs are respectively allowed to cooperate mutually to inhibit the retry operation of other IC which has a lower priority until the retry operation of the IC which has a higher priority is completed, and the ICs are connected together so that the retry operation is managed so as to turn on only one semiconductor element. However, in an actual circuit, the two or more semiconductor elements controlled by the different ICs are rarely interrupted at the same time. Therefore, it is not desirable in view of the increase of cost to incorporate a control that exclusive terminals are provided in the ICs to connect the ICs together and manage the priority. In the present embodiment, in order to prevent the erroneous interruption that the semiconductor elements are turned on at the same time, during the retry operation, the time intervals of a first prescribed time (t1) and a second prescribed time (t2) are changed at random. In such a way, even when the two or more semiconductor elements controlled by the different ICs are interrupted at the same time, the timings at which the semiconductor elements are turned on during the retry operation do not correspond to each other. Thus, the semiconductor elements may be avoided from being turned on at the same time.

Further, in the first embodiment, the first decided voltage L-V1 and the second decided voltage V3 are set to decide whether the interrupted state is maintained or the retry operation is continuously carried out depending on the relation between the voltage V1 of the point P1 and the decided voltages L-V1 and V3 respectively. However, the present invention is not limited thereto. As the decided voltage, only the first decided voltage L-V1 slightly higher than the lower limit value of the in-phase input voltage may be set and when the voltage V1 of the point P1 is lower than the first decided voltage L-V1, the interrupted state of the semiconductor element T1 may be held. In this case, since the semiconductor element T1 may be turned off before the input voltage of the comparator CMP 1 is lower than the lower limit value of the in-phase input voltage, the occurrence of a malfunction may be prevented.

Further, only the first decided voltage L-V1 may be set, and when the voltage V1 of the point P1 is lower than the first decided voltage L-V1, the retry operation may be carried out. If the number of times that the minimum value of the voltage V1 is lower than the first decided voltage L-V1 when the semiconductor element T1 is turned on reaches a prescribed number of times continuously, the interrupted state of the semiconductor element T1 may be held.

Now, a second embodiment will be described below. In the above-described first embodiment, the retry operation is carried out, and when the voltage V1 repeatedly shows "V1<L-V1" N1 times or when the voltage V1 repeatedly shows "L-V1<the minimum value of V1<V3" N2 times, the interruption of the semiconductor element T1 is latched to protect the load circuit. However, when the short-circuit of the wiring such as the dead short-circuit occurs, the voltage V1 may be lowered, and, the minimum value thereof may possibly correspond to the first decided voltage L-V1 or may be close thereto depending on a condition, which is extremely rare.

In this case, although the dead short circuit occurs, the voltage V1 may vary above and below the first decided voltage L-V1 during the period of the retry operation. That is, the voltage V1 may be occasionally "V1<L-V1 or "L-V1<the minimum value of V1<V3". Accordingly, since the first counter 16a and the second counter 16b are reset by the processes of the steps S32 and S23 shown in FIG. 2 to continuously carry out the retry operation, the semiconductor element T1 cannot be latched to a turning off state.

Further, when the retry operation is carried out at intervals of the first time t1 or the second time t2, as a wave form of the voltage V1, the same wave form is not reproduced every time and an unevenness arises in the wave form. This phenomenon arises, because an electric charge of the gate of the semiconductor element T1 is not completely discharged during a turning off period of the semiconductor element T1 till the start of the retry operation or a quantity of the remaining electric charge of the gate is uneven due to Miller effect occurring between the wave form of the voltage V1 and the capacity of the gate.

As a result, since the dead short circuit occurs, the first counter 16a or the second counter 16b needs to continuously count up and hold the semiconductor element T1 in an interrupted state, however, the voltage V1 may occasionally vary above and below the first decided voltage L-V1 to continuously carry out the retry operation. In an electric power supply device of the second embodiment assuredly discriminates, in such a case, the change of a voltage V1 due to a dead short-circuit from the change of the voltage V1 due to an imperfect contact of a connector to control a semiconductor element T1 to be turned on and off.

Figure 7:
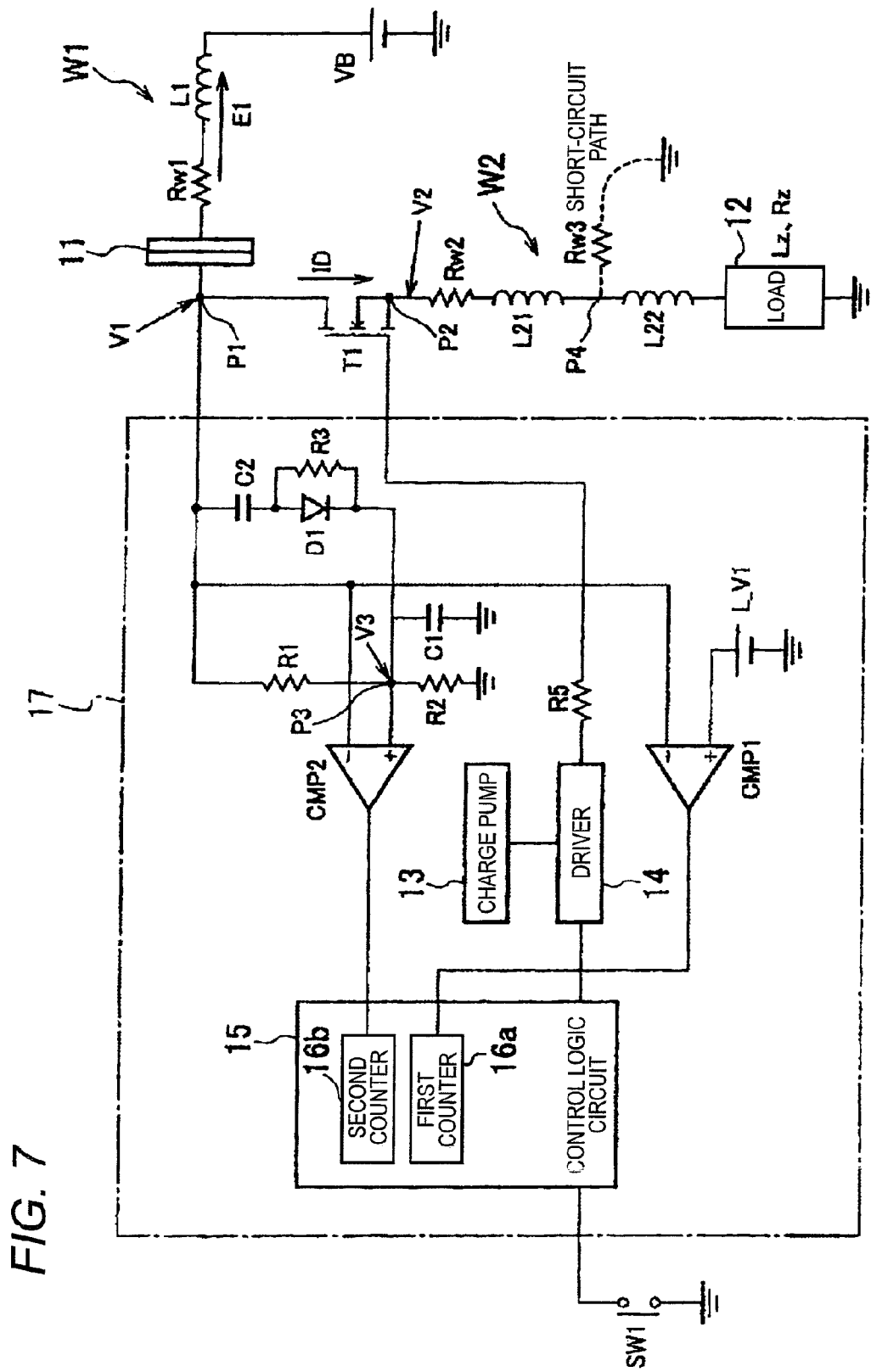
FIG. 7 is a circuit diagram showing the structure of an electric power supply device according to a second embodiment of the present invention.

FIG. 7 is a circuit diagram of the electric power supply device according to the second embodiment. As shown in FIG. 7, a circuit shown in FIG. 7 is different from the circuit shown in FIG. 1 in a point that a capacitor C2, a diode D1 and a resistance R3 are added. That is, a series connecting circuit of the capacitor C2 and the diode D1 is inserted between a point P1 and a point P3 and the resistance R3 is further provided in parallel with the diode D1. Further, in the second embodiment, a relation between the above-described first time t1 and second time t2 is set to "t1>t2".

Now, an operation of the electric power supply device according to the second embodiment will be described below. When a voltage V1 is lowered to be "V1<L-V1" due to the occurrence of a dead short-circuit to interrupt a semiconductor element T1, a retry operation is repeated at intervals of the first time t1. The voltage V1 at this time changes as in the characteristic curve S1 shown in FIG. 4. When the semiconductor element T1 is interrupted due to the occurrence of the dead short-circuit, then, the voltage V1 rises to exceed a source voltage VB (see a voltage q11 in FIG. 4). For instance, when the source voltage VB is 12 V, the voltage q11 is about 18V, about 6V higher than the source voltage. Due to the rise of the voltage V1, a charging current is supplied to the capacitor C2 shown in FIG. 7 to supply the charging current of the capacitor C2 to a capacitor C1 via the diode D1 and charge the capacitor C1.

A charging quantity of the capacitor C1 at a time is determined in accordance with the capacity of the capacitor C2 and a quantity of rise (that is, a quantity of rise of the voltage q11) when the voltage V1 rises to exceed the source voltage VB. Even when the voltage V1 rises to exceed the source voltage VB, the voltage V1 returns to the source voltage VB in a short period (about 6 µsec). Accordingly, an electric charge with which the capacitor C1 is charged from the capacitor C2 is substantially discharged after the first time t1 elapses, however, the electric charge slightly remains after the elapse of the second time t2 shorter than the first time t1.

Here, when the voltage V1 of the point P1 becomes "V1<L-V1" to repeat the retry operation at intervals of the time T1, the voltage V1 becomes "V3>the minimum value of V1>L-V1", and then, the retry operation is switched to a retry operation at intervals of the time t2. Then, under a state that a charging electric charge by the capacitor C2 remains in the capacitor C1, the voltage V1 is compared with a second decided voltage V3.

Figure 8:
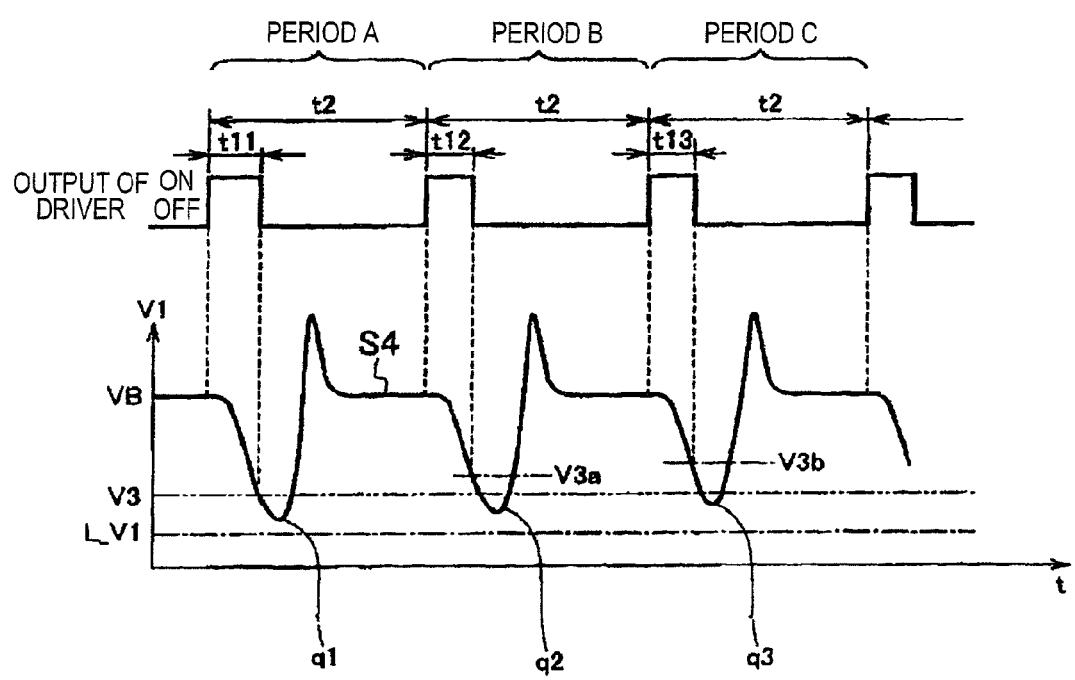
FIG. 8 is a characteristic view showing the change of a voltage V1 when a dead short-circuit occurs and a second decided voltage V3 gradually rises in the second embodiment of the present invention.
Figure 9:
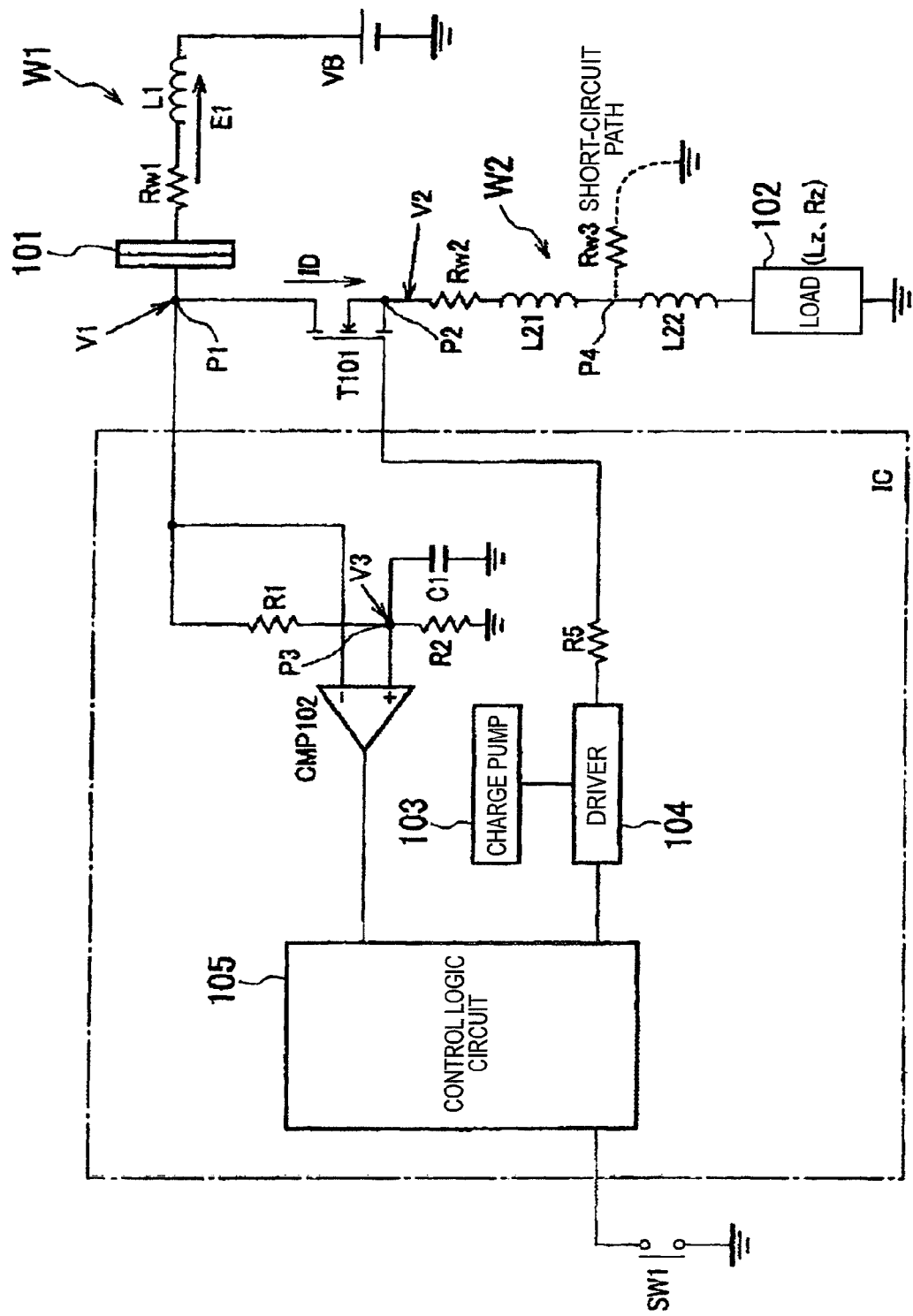
FIG. 9 is a circuit diagram showing the structure of a usual electric power supply device.
Figure 10A:
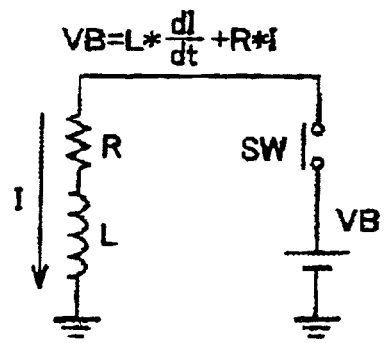
FIGS. 10A to 10D are diagrams for explaining a principle that a voltage V1 is lowered when a dead short circuit occurs.
Figure 10B:
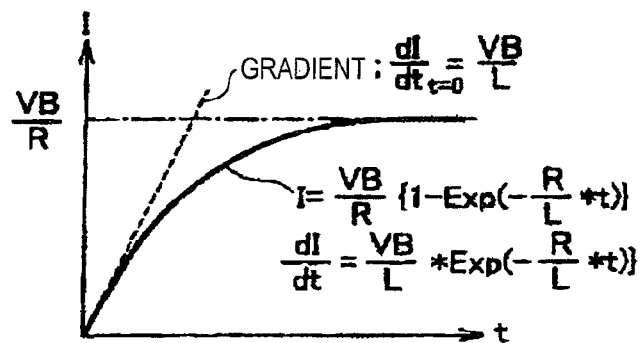
Figure 10C:
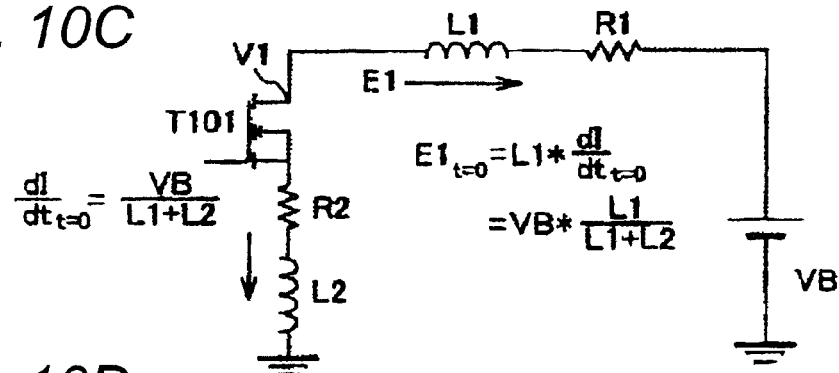
Figure 10D:
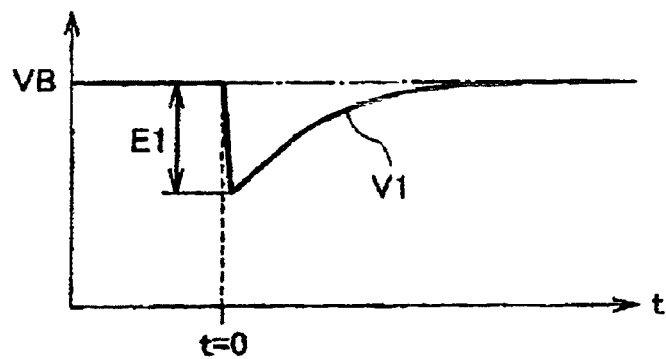

In this case, since the second decided voltage V3 changes to a voltage higher than that at an ordinary time, an interruption of the semiconductor element T1 is accelerated. Now, this operation will be described below by referring to a characteristic view shown in FIG. 8. As shown in FIG. 8, in a first retry period A (time t2), when the voltage V1 is lower than the second decided voltage V3 (when a time t11 elapses), the semiconductor element T1 is turned off. Accordingly, the voltage V1 shown in a characteristic curve S4 is lowered to a minimum value q1, and then, rises to exceed the source voltage VB, and then, is stabilized to the source voltage VB.

Further, in a second retry period B (time t2), since the electric charge with which the capacitor C1 is charged from the capacitor C2 is not completely discharged as described, the second decided voltage is a voltage V3a higher than V3 at the ordinary time. Therefore, an elapse time is reduced until the semiconductor element T1 is turned off and is a time t12 (t12<t11). Accordingly, a timing at which the voltage V1 rises is accelerated. When the voltage V1 is lowered to a minimum value q2 (q2>q1), the voltage V1 begins to rise. After that, the voltage V1 exceeds the source voltage VB and is further lowered to be stabilized to the source voltage VB.

Then, in a third retry period C (time t2), since the electric charge with which the capacitor C1 is charged from the capacitor C2 is not completely discharged as in the last time, the second decided voltage is a voltage V3b further higher than V3a of the last time. Therefore, an elapse time is more reduced until the semiconductor element T1 is turned off and is a time t13 (t13<t12). Accordingly, a timing at which the voltage V1 rises is more accelerated. When the voltage V1 is lowered to a minimum value q3 (q3>q2), the voltage V1 begins to rise. After that, the voltage V1 exceeds the source voltage VB and is further lowered to be stabilized to the source voltage VB.

Namely, when the retry operation is cyclically repeated at intervals of the time t2, the second decided voltage V3 is gradually increased, so that the voltage V1 is hardly lower than the first decided voltage L-V1. In other words, the voltage V1 may be restrained from varying above and below the first decided voltage L-V1. Therefore, the second counter 16b continuously counts up and overflows to hold the semiconductor element T1 in an interrupted state.

On the other hand, when the voltage V1 is abruptly lowered due to an imperfect contact of a connector 11 included in a power line, then, if the imperfect contact is cancelled and the voltage V1 rises, the voltage V1 does not exceed the source voltage VB or slightly exceeds the source voltage. Namely, when the voltage V1 is abruptly lowered due to the imperfect contact of the connector 11, then, if V1 rises, the voltage hardly rises as shown by a sign x1 of FIG. 6. Therefore, the charging current of the capacitor C2 is hardly supplied so that the voltage of the capacitor C1 is not raised. That is, when the voltage V1 is abruptly lowered due to the imperfect contact of the connector 11, the second decided voltage V3 does not gradually rise as shown in FIG. 8.

Accordingly, when the voltage V1 is lowered due to an instantaneous interruption of the source voltage VB, an additional circuit of the respective elements C2, D1 and R3 hardly gives an influence to the retry operation. Accordingly, when the imperfect contact of the connector 11 is repeated by a vibration, since an operation that the voltage V1 is switched between "V1<L-V1" and "L-V1<V1<V3" is not broken, a function for avoiding an erroneous interruption due to the imperfect contact is not changed.

Further, when the dead short-circuit occurs and the voltage V1 is lower than the first decided voltage L-V1, since the retry operation is cyclically carried out at intervals of the first time t1 (t1>t2), even if the electric charge of the capacitor C2 is accumulated in the capacitor C1, the electric charge accumulated by the capacitor C2 is completely discharged until the time t1 elapses. Thus, the second decided voltage V3 does not rise.

Figure 4:
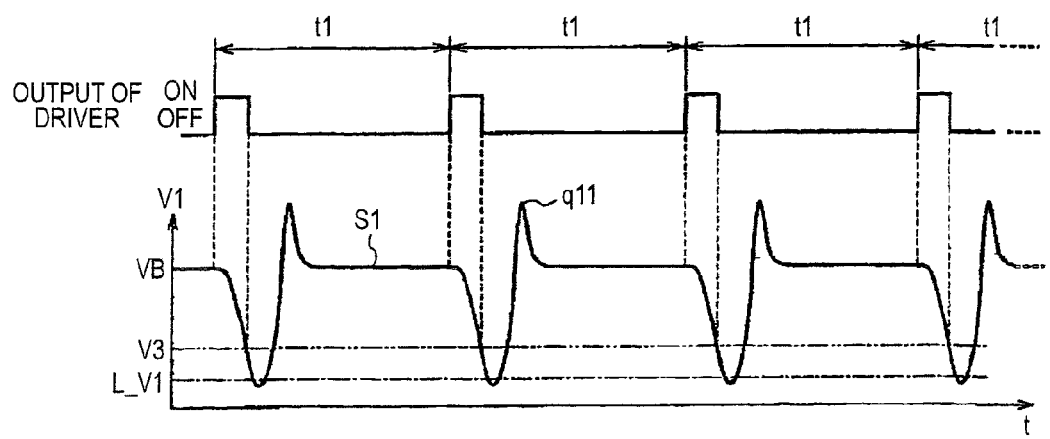
FIG. 4 is a characteristic view showing the change of a voltage V1 when a dead short-circuit occurs and the minimum value of the voltage V1 is continuously lower than a first decided voltage L-V1 in the first embodiment of the present invention.

Namely, as shown in FIG. 4, when the minimum value of the voltage V1 is lower than the first decided voltage L-V1, since the second voltage V3 does not rise, the minimum value of the voltage V1 does not rise to continuously repeat "V1<L-V1" so that the load circuit may be assuredly interrupted.

As described above, in the electric power supply device according to the second embodiment, the capacitor C2, the diode D1 and the resistance R3 are added to the electric power supply device shown in the first embodiment. Thus, even when the minimum value of the voltage V1 corresponds to the first decided voltage L-V1 or is a value close thereto, the circuit may be assuredly protected when the dead-short circuit occurs. Further, in the case of the imperfect contact of the connector, the semiconductor element T1 may be assuredly returned to a turning on state.

The electric power supply device of the present invention is explained as described above in accordance with the illustrated embodiment. However, the present invention is not limited thereto and structures of respective parts may be replaced by arbitrary structures having the same functions.

For instance, in the above-described embodiment, as the semiconductor element, a case that the MOSFET is used is described as an example. However, the present invention is not limited thereto, and a semiconductor element such as an IGBT (an insulating bipolar transistor) may be used.

Further, in the above-described embodiment, a case that the electric power is supplied to the load mounted on the vehicle is described as an example, however, the present invention is not limited thereto, and the present invention may be applied to other load circuits. The application of the present invention is based on Japanese Patent Application (Japanese Patent Application No. 2008-72324) filed on Mar. 19, 2008 and contents thereof are incorporated herein as a reference.

INDUSTRIAL APPLICABILITY

The present invention is remarkably useful for assuredly interrupting a semiconductor element when a short-circuit of a wiring such as a dead short-circuit occurs, and maintaining the semiconductor element in a turning on state when an imperfect contact of a connector occurs.

The invention claimed is:

1. An electric power supply device comprising:
a semiconductor element;
a power source having a positive terminal to which a first main electrode of the semiconductor element is connected through a wiring of a power source side;
a load connected between a second main electrode of the semiconductor element and a ground; and
a control portion that controls the semiconductor to be turned on and off to supply an electric power to the load,
wherein when a first voltage of a point between the first main electrode and the wiring of the power source side is lower than a first decided voltage, the control portion controls the semiconductor element to be turned off, and the control portion controls the semiconductor element to be turned on when a first prescribed time is elapsed after the semiconductor element is turned off; and
wherein when the semiconductor element is turned on after the first prescribed time is elapsed so that a minimum value of the first voltage exceeds the first decided voltage, the control portion controls the semiconductor element to continue a turning on state, and when the first voltage is lower than the first decided voltage, the control portion controls the semiconductor element to hold a turning off state.

2. An electric power supply device comprising:
a plurality of load circuits, each of which having a semiconductor element and a load connected in series, wherein first main electrodes of the plurality of semiconductor elements are respectively connected together through a first connecting point,
a power source having a positive terminal to which the first connecting point is connected only through a wiring of a power source side, wherein second main electrodes of the plurality of semiconductor elements are respectively connected to the loads corresponding thereto; and a plurality of control portions that respectively control the semiconductor elements corresponding to the load circuits to be turned on and off to supply an electric power to the corresponding load circuits, wherein when a first voltage of the first connecting point is lower than a first decided voltage, the control portions control all the semiconductor elements in turning on states to be turned off, and the control portions control the semiconductor element that are turned off to be sequentially turned on with a prescribed time difference when a first prescribed time is elapsed after the semiconductor elements are turned off; and wherein when the semiconductor elements are turned on after the first prescribed time is elapsed so that a minimum value of the first voltage exceeds the first decided voltage, the control portions control the semiconductor elements to continue turning on states, and when the first voltage is lower than the first decided voltage, the control portions control the semiconductor elements to respectively hold turning off states.

3. The electric power supply device according to claim 1, wherein when the first voltage is lower than the first decided voltage, the control portion controls the semiconductor element to be turned off, then, when the semiconductor element is turned on after the first prescribed time is elapsed, if the first voltage is lower than the first decided voltage again, the control portion controls the semiconductor element to be turned off again, and then, when the control portion repeats an operation for turning on the semiconductor element again after the first prescribed time is elapsed a first prescribed number of times so that the first voltage obtained when the semiconductor element is turned on during all tries is lower than the first decided voltage, the control portion controls the semiconductor element to hold the turning off state.

4. The electric power supply device according to claim 3, wherein the control portion sets a second decided voltage higher than the first decided voltage, then, when the first voltage is lower than the first decided voltage, the control portion controls the semiconductor element in a turning on state to be turned off, then, when the semiconductor element is turned on again after the first prescribed time is elapsed, if the minimum value of the first voltage is higher than the first decided voltage and is lower than the second decided voltage, the control portion controls the semiconductor element to be repeatedly turned on and off at intervals of a second prescribed time, then, when the first voltage is lower than the first decided voltage during a repeating time, the control portion controls the semiconductor element to be repeatedly turned on and off at intervals of the first prescribed time, and during a process of the repeated control, when the semiconductor element is turned on, if the minimum voltage of the first voltage is repeatedly higher than the first decided voltage and is lower than the second decided voltage continuously a second number of times, or if the minimum value of the first voltage is repeatedly lower than the first decided voltage continuously the first number of times, the control portion controls the semiconductor element to hold an interrupted state.

5. The electric power supply device according to claim 4, wherein when the semiconductor element is turned on again after the semiconductor element is turned off, if the minimum value of the first voltage is higher than the first decided voltage and is lower than the second decided voltage, the control portion raises the second decided voltage and then controls the semiconductor element to be turned on.

6. The electric power supply device according to claim 3, wherein the first prescribed time is changed at random.

7. The electric power supply device according to claim 4, wherein the first prescribed time and the second prescribed time are changed at random.

8. The electric power supply device according to claim 2, wherein when the first voltage is lower than the first decided voltage, the control portion controls all the semiconductor elements in turning on states to be turned off, then, when the semiconductor elements that are turned off are sequentially and respectively turned on after the first prescribed time is elapsed, if the first voltage is lower than the first decided voltage again, the control portion controls the semiconductor elements in turning on states to be turned off again, and then, when the control portion repeats an operation for turning on one of the semiconductor elements again after the first prescribed time is elapsed a first prescribed number of times so that the first voltage obtained when the relevant semiconductor element is turned on is lower than the first decided voltage during all tries, the control portion controls the relevant semiconductor element to hold the turning off state.

9. The electric power supply device according to claim 8, wherein the control portion sets a second decided voltage higher than the first decided voltage, then, when the first voltage is lower than the first decided voltage, the control portion controls the semiconductor elements in a turning on state to be turned off, then, when one of the semiconductor elements is turned on again after the first prescribed time is elapsed, if the minimum value of the first voltage is higher than the first decided voltage and is lower than the second decided voltage, the control portion controls the relevant semiconductor element to be repeatedly turned on and off at intervals of a second prescribed time, then, when the first voltage is lower than the first decided voltage during a repeating time, the control portion controls the relevant semiconductor element to be repeatedly turned on and off at intervals of the first prescribed time, and during a process of the repeated control, when the relevant semiconductor element is turned on, if the minimum voltage of the first voltage is repeatedly higher than the first decided voltage and is lower than the second decided voltage continuously a second number of times, or if the minimum value of the first voltage is repeatedly lower than the first decided voltage continuously the first number of times, the control portion controls the relevant semiconductor element to hold an interrupted state.

10. The electric power supply device according to claim 9, wherein when the semiconductor elements are sequentially turned on again after the semiconductor elements are turned off, if the minimum value of the first voltage is higher than the first decided voltage and is lower than the second decided voltage, the control portion raises the second decided voltage and then controls the semiconductor elements to be turned on.

11. The electric power supply device according to claim 8, wherein the first prescribed time is changed at random.

12. The electric power supply device according to claim 9, wherein the first prescribed time and the second prescribed time are changed at random.

* * * * *